United States Patent [19]

Harris et al.

[11] Patent Number: 4,956,047
[45] Date of Patent: Sep. 11, 1990

[54] PROCESS OF MAKING HIGH QUALITY SINGLE QUARTZ CRYSTAL USING SILICA GLASS NUTRIENT

[75] Inventors: Meckie T. Harris, Nashua, N.H.; John J. Larkin, South Boston, Mass.; Alton F. Armington, Lexington, Mass.; John K. Kennedy, West Roxbury, Mass.

[73] Assignee: The United States of America as represented by the Secretary of the Air Force, Washington, D.C.

[21] Appl. No.: 229,686

[22] Filed: Aug. 8, 1988

[51] Int. Cl.$^5$ .................................................. C30B 7/10
[52] U.S. Cl. ........................ 156/623 Q; 156/DIG. 64
[58] Field of Search ........ 156/623 Q, 623 R, DIG. 64

[56] References Cited

U.S. PATENT DOCUMENTS

| | | | |
|---|---|---|---|
| 2,785,058 | 3/1957 | Buehler | 156/623 Q |
| 2,871,192 | 1/1959 | Augustine et al. | 252/62.9 |
| 2,895,812 | 7/1959 | Kohman | 23/301 |
| 2,923,606 | 2/1960 | Hale et al. | 23/301 |
| 3,291,575 | 12/1966 | Sawyer | 23/301 |
| 3,623,847 | 11/1971 | Gehres et al. | 23/301 |
| 3,917,506 | 11/1975 | Lind et al. | 156/621 |
| 3,976,535 | 8/1976 | Barns | 156/601 |
| 4,512,846 | 4/1985 | Shlichta | 156/623 Q |
| 4,529,430 | 7/1985 | Lazarev et al. | 65/33 |
| 4,576,808 | 3/1986 | Armington et al. | 423/335 |

FOREIGN PATENT DOCUMENTS 1329275 9/1973 United Kingdom ............ 156/623 R

Primary Examiner—Melvyn J. Andrews
Attorney, Agent, or Firm—Stanton E. Collier; Donald J. Singer

[57] ABSTRACT

Ultra high pure quartz is grown by a one step in-situ growth process where the nutrient is high purity silica. A negative temperature gradient is maintained between the nutrient zone and the seed zone until about the start of crystal growth. A sealable container made of silver contains the nutrient and the seed within the autoclave chamber.

12 Claims, 1 Drawing Sheet

PROCESS OF MAKING HIGH QUALITY SINGLE QUARTZ CRYSTAL USING SILICA GLASS NUTRIENT

STATEMENT OF GOVERNMENT INTEREST

The invention described herein may be manufactured and used by or for the Government for governmental purposes without the payment of any royalty thereon.

BACKGROUND OF THE INVENTION

This invention relates to synthetic quartz crystals, and, in particular, to quartz crystals having ultra high purity.

Quartz, chemically composed of silicondioxide and trace amounts of other materials such as aluminum and sodium and lithium alkalies, is one of the most abundant minerals in our geological environment. It often occurs in crystalline form and, most often, is colorless and translucent. Its crystallized structure is either right-handed or left-handed and rotates the plane of polarization of transmitted light. One of its properties, that make it especially useful for a wide variety of industrial and military applications, is its piezoelectricity. That is the crystal is capable of producing an electric charge on some of its surfaces when the crystal is compressed in certain directions. The charge disappears when the compression is removed. This particular property makes quartz crystals especially useful in microphones, phonograph pickups, ultrasonic generators and in electromechanical devices, such as frequency-controlling quartz crystal resonators. These quartz crystal resonators are widely used in military and commercial communication systems for carrier-frequency separation and for selecting a desired frequency signal while rejecting undesired frequencies.

Generally, the piezoelectric quartz crystals used for industrial and military applications are synthetic in nature and grown commercially using a number of conventional crystal growing techniques. One of the more successful processes employed universally for synthetic quartz growth is the so-called hydrothermal technique. It is similar in theory to the well known solution growth technique and involves growing quartz crystals under high temperatures and pressures. Nutrient, or feed material, is dissolved in a high temperature region of a vessel. The solution is transported by thermal gradients to a lower temperature region, becomes supersaturated and the material precipitates on a quartz crystal seed in single crystal form. The temperatures involved in the hydrothermal process are higher than in solution growth and pressures of 1000 atmospheres or more may be used.

In the hydrothermal process, quartz growth takes place usually in a high pressure autoclave. The interior diameter of the autoclave is between 25-35 cm and the height between 3-5 meters. The nutrient, usually natural quartz chips, also called lascas, is placed in the bottom of the autoclave and separated from the top by a baffle containing small holes. Production autoclaves often use from 100-150 kg of nutrient per run. The quartz crystal seeds are suspended on racks positioned in the upper region of the autoclave which is at a lower temperature than the bottom. Typically, there are over 100 seeds in the autoclave. Thermal insulation is placed around the outside of the autoclave. All vessels used commercially are fabricated from steel and these are often buried in the ground or enclosed in heavy metal sheets as a safety factor.

Three crucial growth parameters, pressure, temperature, and fill are interrelated in the hydrothermal process, pressure being a function of temperature and fill. The fill, i.e., the percentage of the vessel volume filled with solid and liquid prior to sealing, is generally about 80 percent. At growth temperatures, owing to thermal expansion of water, the vessel is almost entirely filled with liquid. Fill is the most important parameter determining the average autoclave pressure. A ten percent change in fill will increase the pressure more than two fold at 350° C. The fill for quartz has been varied from 65 to 88 percent corresponding to pressures of 150 to 3000 atmospheres. Most present commercial growth processes use up to 1500 atmospheres pressure.

The effect of temperature on pressure is less significant than fill, but temperature must be carefully controlled to prevent the pressure from exceeding autoclave mechanical design limits. Catastrophic failures have occurred even at commercial establishments. For alpha-quartz the growth, the growth $T_g$ near the seeds, can be varied from 200° to 573° C. At 200° the reaction is very slow but above 573° C. undesirable beta quartz is formed. Typical growth temperatures vary from 340° to 375° C.

The temperature differential T, between the two sections of the autoclave, the top part containing the seeds and the bottom part containing the nutrient, is significant to growth rate and can be varied between 5° and 100° C. In general however, the differential depends on the growth process and desired grade. More uniform crystals are obtained with smaller temperature differentials. The proper temperature differential, profile, and schedule for constant growth rate is usually established empirically for each autoclave.

The solubility of quartz in water under hydrothermal conditions ranges from 0.1 to 0.5 weight percent. These values can be increased to the desirable level of 2-5 percent by the addition of a mineralizer solution to the nutrient solution. The mineralizer solution can be either sodium hydroxide or sodium carbonate in the range of 0.5 to 1 normal. The growth rate of quartz is slow compared to most single crystal techniques being in the range of 20 to 40 mil/day. Thus, to produce material of the desired size growth runs can extend from 25 to over a hundred days.

The impurity of crystal produced by this process are on the order of 1 to 3, parts per million atomic by atomic absorption. The purity had been improved by oriented seed growth as disclosed in U.S. Pat. No. 4,576,808 which is incorporated by reference.

The use of silica nutrient as a starting material has not been used in the past because the much higher solubility of silica caused too much silicate to be in solution at the lower temperature used for growth. This is transported into the growth zone and is deposited on the seed at temperatures below the range of formation of high quality quartz. All subsequent growth at normal growth temperatures is deposited on this and is subject to strain and twinning.

Impurities and macroscopic inclusions (particulates) can be introduced into the growing quartz crystal by impurity ions present in the crystal growth environment. These may be contributed from the impurities present in the nutrient (pieces of natural quartz or synthetic quartz grown in a prior run), the mineralizer (sodium hydroxide or sodium carbonate in water, with a small amount of lithium ion often added to promote growth), the walls of the autoclave (a high tensile stainless steel) or the seed racks, baffles, baskets, and other hardware in the autoclave.

Most synthetic quartz is grown using natural quartz (lascas) as nutrient. The purity of this nutrient is subject to the conditions under which it was formed in nature, and can vary widely. A degree of purification may be achieved by using previously grown synthetic crystals as nutrient. Nevertheless, these were grown from natural quartz, and are subject to some of the same impurities. Quartz has also been grown in a two step process using silica as the source material. This involves a recrystallization of the glass under hydrothermal conditions in one step, removal of the crystallized product from the liner in which it was processed, and subsequent growth using this material as nutrient. The advantage of this is that silica glass can be obtained in almost any desired purity. Glasses produced by chemical vapor deposition have essentially undetectable concentrations of all metallic impurities. There are several disadvantages however: (1) Recrystallization of the quartz involves an additional step and requires dedicating an autoclave to this purpose for up to two weeks; (2) Much of the recrystallized material must be mechanically removed from the liner, resulting in a mixture of powders and various size pieces; (3) A recrystallization run will at most provide material for one and half to two growth runs; and (4) The product of the recrystallization run is microcrystalline and porous. It is very subject to contamination during storage and handling.

Because of these problems and the need for higher purity quartz crystals than previously produced, the search for another process and apparatus resulted in the present invention.

SUMMARY OF THE INVENTION

The present invention overcomes the problems encountered in the past and described in detail hereinabove by providing a process wherein high purity silica glass is used as the nutrient in a one step in-situ growth of quartz.

The present invention provides ultra high purity quartz by selectively controlling the thermal program in the seed and nutrient zones, controlling the nutrient geometry in that zone, controlling the seed dissolution and providing inert liners in the autoclave.

Therefore, one object of the present invention is to provide a process of producing ultra high purity quartz single crystals.

Another object of the present invention is to provide a process that uses silica nutrient of a fiber optical quality.

Another object of the present invention is to provide a process that uses silica nutrient in a one step in-situ growth.

Another object of the present invention is to provide a process that produces quartz of superior morphology, lack of strain, lack of twinning, etc.

Another object of the present invention is to provide an apparatus that minimizes nucleation thereon.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
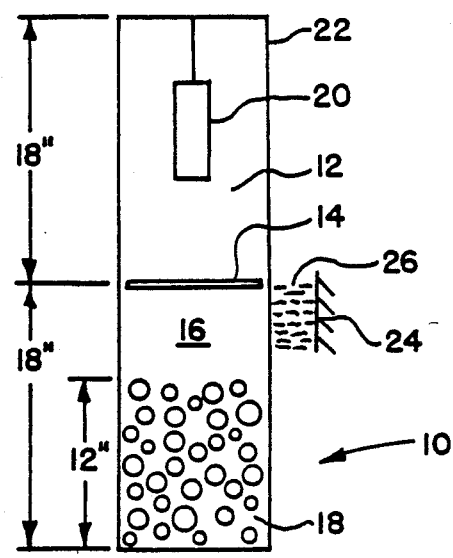
FIG. 1 illustrates by schematic the internal arrangement of a lined hydrothermal apparatus.

Referring to FIG. 1, a container 10 is placed within the chamber of a conventional crystal growth autoclave which is not shown.

As noted above, impurities and inclusions can be introduced into the growing crystal by impurity ions present in the growth environment. Control of impurities and particulates can be attained by removing the above sources of impurity. Thus the growing environment of the crystal can be isolated from the autoclave walls 24 by enclosing the entire interior growth and nutrient area in a sealed noble metal liner 22 such as silver which is pressure balanced by adding a calculated amount of aqueous solution 26 to the volume outside the liner 22. Internal hardware as mentioned above can be replaced by parts fabricated out of noble metal. High purity water and chemicals can be used to make up the mineralizer. As seen in FIG. 1, the liner 22 is a totally enclosed container. A top lid, not shown in detail, is welded on after a silica nutrient 18, a baffle 14, a seed 20, etc. are placed inside the liner 22.

To minimize nutrient impurities, high purity silica glass is placed in bulk at the bottom of the liner 22. For the highest purity, ultra high purity silica obtained from chemical vapor deposition, such as is used in the optical fiber industry may be used. The quartz produced by the invention was of unprecedented purity and impurities such as aluminum, iron, lithium and potassium were below detectable limits. For example, aluminum is under 50 parts per billion.

One of the major problems associated with the one step in-situ growth is the isolation of the growth seed from the very high concentrations of silica in solution during the initial stages of the devitrification process where dissolution of the silica glass competes with devitrification. Once a contiguous surface layer of the silica glass has devitrified, solubility drops to that of quartz. Additionally, the seed zone must also reach normal crystallization temperature as quickly as possible to prevent crystallization of quartz on the seed.

In order to use silica glass as the nutrient, four areas of growth technology must be changed. These areas are selective thermal control in a nutrient zone 16 and a seed zone 12, nutrient geometry, seed dissolution control, and removal of extrinsic sources of impurities.

Figure 2:
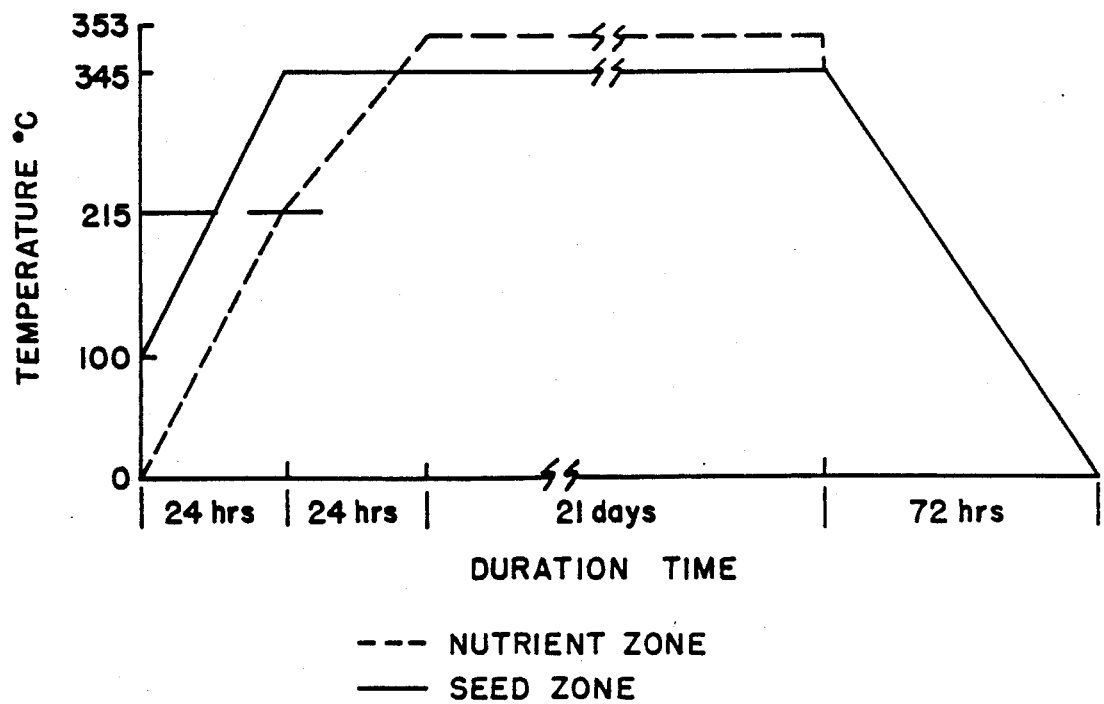
FIG. 2 illustrates the temperature program for in-situ growth of quarts from silica glass.

Thermal Control—Rather than bringing the temperature of the seed zone 12 and nutrient zone 16 up to growth conditions together, as is the case for conventional hydrothermal growth, a rather large negative gradient, see FIG. 2, must be established, sufficient to suppress convection transport of the solution from the nutrient zone 16. Thus the nutrient zone 16, is kept much cooler than the seed zone 12 initially. This temperature difference depends on system geometry, and in some configurations may require gradients in excess of 100 degrees C. This encourages stratification of the solution and allows devitrification to proceed in the nutrient zone 16. The large concentrations of quartz produced in solution by simultaneous dissolution of the glass are confined to the nutrient zone 16 during this negative gradient heating period by the fact that there is no convection in a fluid system in which the bottom is colder than the top. Although some diffusion does undoubtably take place, the solutions are viscous and this is a slow process. This negative gradient must be maintained for period of time sufficient to permit at least surface recrystallization of the glass. The seed zone 12, however, must be brought to growth temperature as soon as possible. This prevents growth on the quartz seeds at low temperature. A practical temperature program to accomplish this is produced by ramping the seed zone 12 linearly from room temperature to its final temperature (345 C) in 24 hours. Simultaneously the nutrient zone 16 temperature is ramped linearly to a temperature of 130 degrees less that of the top (215 C) over 24 hours. For the next 24 hours the seed zone 12 is maintained at constant temperature while the nutrient zone 16 is ramped linearly to its final growth temperature. In the example chosen, the nutrient zone temperature for growth is 353 degree C. The initial program takes 48 hours to run, and growth times may be extended to produce a crystal of the size required.

Nutrient Geometry—silica glass nutrient must not be a height in the nutrient zone 16 of more than two thirds of the total available space. Thus, in nutrient zone 16 of 18 inches length, the nutrient level should be at least six inches below the baffle 14. In the inverted gradient the temperature change in the region of the baffle 14 is much more gradual than in the normal gradient where convection currents dominate. The temperature profile here is dominated by thermal conduction in the fluid and through the liner 22. If the nutrient extends too close to the baffle 14, not only is the top of the nutrient 18 much hotter than the applied gradient would be expected to produce, but the path for diffusion of the supersaturated solution in the nutrient zone 16 is reduced.

Seed Geometry—The solution in the seed zone 12 becomes undersaturated with respect to the seeds as the temperature of the seed zone 12 increases. Dissolution of the seed 20 is likely to occur. This effect can be ameliorated by one or more of the following actions.

(1) Thick seeds may be used. The dissolution process appears to be rate limited and seeds of 4–5 mm thickness, although thinned considerably, will survive.

(2) Additional bulk quartz may be put in the seed zone 12. Dissolution of this quartz raises the saturation in the seed zone 12 and slows seed 20 dissolution.

(3) A solution with a controlled concentration of silica may be used to fill the autoclave (e.g. sodium metasilicate solutions). This also protects the seed 20.

Liner Selection—Inert liners 22 should be used in this process. Spontaneous nucleation takes place in this process, especially in the nutrient zone 16, and if the process is run in an unlined autoclave, cleanup of the autoclave becomes a major problem.

Clearly, many modifications and variations of the present invention are possible in light of the above teachings and it is therefore understood, that within the inventive scope of the inventive concept, the invention may be practiced otherwise than specifically claimed.

What is claimed is:

1. A process of manufacturing ultra high purity quartz crystals, said process comprising the steps of:
   a. obtaining silica nutrient having very few impurities therein;
   b. providing at least one quartz seed;
   c. providing a sealable container having a positionable baffle therein and means for holding said at least one quartz seed, said container, said baffle and said holding means being made of a noble metal, said container being placable in a hydrothermal autoclave;
   d. placing the silica nutrient in a nutrient zone being a bottom section of the sealable container;
   e. putting a baffle over the nutrient zone and below a seed zone;
   f. attaching the at least one seed in the seed zone being in a top section of the container;
   g. filling the container with a fluid;
   h. sealing the container;
   i. placing the sealed container in a chamber of the hydrothermal autoclave;
   j. filling the void between the sealed container and the autoclave with a fluid;
   k. sealing the autoclave;
   l. heating said nutrient zone in a controlled manner;
   m. heating said seed zone in a controlled manner, said nutrient zone having a negative temperature gradient to prevent convection transport with respect to said seed zone during an initial heating before crystal growth;
   n. growing quartz about the seed wherein the nutrient zone is at a higher temperature than said seed zone, said nutrient zone having a positive temperature gradient to encourage convention transport with respect to said seed zone;
   o. cooling the autoclave; and
   p. removing at least one quartz crystal from the autoclave.

2. A process as defined in claim 1, step a, wherein the silica nutritent is obtained through a chemical vapor deposition process.

3. A process as defined in claim 1, step b, wherein the quartz seed is cut from the X-plus growing region of a synthetic quartz, single crystal boule.

4. A process as defined in claim 1, step d, wherein the silica nutrient fills the nutrient zone only to about two thirds a vertical height in the bottom section.

5. A process as defined in claim 1, step b, wherein the seed has a thickness of about 5 millimeters.

6. A process as defined in clailm 1 further including the step of adding bulk quartz in the seed zone to reduce the dissolution of the seed.

7. A process as defined in claim 1, step g, wherein said fluid in the sealable container includes a controlled concentration of silica in solution.

8. A process as defined in claim 7 wherein the silica in solution is sodium metasilicate.

9. A process as defined in claim 1 wherein the growth temperature is about 345° C. and is reached in about one hour.

10. A process as defined in claim 1, step 1, wherein the heating of the nutrient zone provides a negative temperature gradient of about 75° to 150° C. with respect to the temperature in the seed zone during the initial heating.

11. A process as defined in claim 10 wherein the temperature of the nutrient zone is raised to a final temperature in about one hour.

12. A process as defined in claim 11 wherein the final temperature is about 350° C. and is reached in about two hours.

* * * * *